United States Patent
Ino

Patent Number: 5,861,825
Date of Patent: *Jan. 19, 1999

[54] METHOD AND DEVICE FOR CODE MODULATION, METHOD AND DEVICE FOR CODE DEMODULATION, AND METHOD AND DEVICE FOR DECODING

[75] Inventor: Hiroyuki Ino, Chiba, Japan

[73] Assignee: Sony Corporation, Tokyo, Japan

[ * ] Notice: The term of this patent shall not extend beyond the expiration date of Pat. No. 5,638,063.

[21] Appl. No.: 816,349

[22] Filed: Mar. 13, 1997

[30] Foreign Application Priority Data

Mar. 21, 1996 [JP] Japan ................................ 8-064143

[51] Int. Cl.⁶ .................................................. H03M 7/00
[52] U.S. Cl. .............................................. 341/50; 341/58
[58] Field of Search ............................... 341/50, 107, 58, 341/102, 56

[56] References Cited

PUBLICATIONS

PRO–Bit; A Unique Digital Translation System (web page URL: "http://www.yamaha.co.jp/product/av/eng/tec6.html") (May 28, 1998).

Yamaha; CDX–993 Compact Disc Single Player (web page URL:"http://www.yamaha.co.jp/product/av/eng/cdx993.html") (May 28, 1998).

Lawrence Rabiner et al.; Prentice Hall Signal Processing Series; Fundamentals of Speech Recognition; pp. 339–348, Section 6.4– 6.4.4(Aug. 12, 1993).

*Primary Examiner*—Howard L. Williams
*Assistant Examiner*—Peguy JeanPierre
*Attorney, Agent, or Firm*—Limbach & Limbach LLP

[57] ABSTRACT

5*3 states are arranged on a plane composed of the horizontal axis and vertical axis, 2-bit data of 01, 10, 00, and 11 are assigned to the state transitions in the up, down, right, and left-directions respectively in the 3*5 states. A 20-bit code is generated by 10 times the state transitions. $2^{16}$ 20-bit codes are prepared and these codes have a one-to-one correspondence to 16-bit data ($2^{16}$). The end point of the previous state transition is the starting point of the next state transition, and 16-bit data are converted successively to 20-bit codes while the state transitions occur continuously. In the manner as described above, the conversion efficiency in PR (1, 1) is improved.

35 Claims, 10 Drawing Sheets

FIG. 7

STARTING POINT : STATE I
ENDING POINT : STATE I

| STATE TRANSITION | CODE (20 BITS) |
|---|---|
| 1  6 11 12 13 14 13 12 11  6  1 | 01011111110000001010 |
| 1  6  7 12 13 14 13 12 11  6  1 | 01110111110000001010 |
| 1  2  7 12 13 14 13 12 11  6  1 | 11010111110000001010 |
| 1  6  7  8 13 14 13 12 11  6  1 | 01111101110000001010 |
| 1  2  7  8 13 14 13 12 11  6  1 | 11011101110000001010 |
| 1  2  3  8 13 14 13 12 11  6  1 | 11110101110000001010 |
| 1  6  7  8  9 14 13 12 11  6  1 | 01111111010000001010 |
| 1  2  7  8  9 14 13 12 11  6  1 | 11011111010000001010 |
| 1  2  3  8  9 14 13 12 11  6  1 | 11110111010000001010 |
| 1  2  3  4  9 14 13 12 11  6  1 | 11111101010000001010 |
| 1  6 11 12 13 12 13 12 11  6  1 | 01011111001100001010 |
| 1  6  7 12 13 12 13 12 11  6  1 | 01110111001100001010 |
| 1  2  7 12 13 12 13 12 11  6  1 | 11010111001100001010 |
| 1  6  7  8 13 12 13 12 11  6  1 | 01111101001100001010 |
| 1  2  7  8 13 12 13 12 11  6  1 | 11011101001100001010 |
| 1  2  3  8 13 12 13 12 11  6  1 | 11110101001100001010 |
| 1  6 11 12 11 12 13 12 11  6  1 | 01011100111100001010 |
| 1  6  7 12 11 12 13 12 11  6  1 | 01110100111100001010 |
| 1  2  7 12 11 12 13 12 11  6  1 | 11010100111100001010 |
| 1  6 11 10 11 12 13 12 11  6  1 | 01010011111100001010 |
| 1  6  5 10 11 12 13 12 11  6  1 | 01000111111100001010 |
| 1  0  5 10 11 12 13 12 11  6  1 | 00010111111100001010 |
| 1  6 11  6 11 12 13 12 11  6  1 | 01011001111100001010 |
| 1  6  7  6 11 12 13 12 11  6  1 | 01110001111100001010 |
| 1  2  7  6 11 12 13 12 11  6  1 | 11010001111100001010 |
| 1  6  5  6 11 12 13 12 11  6  1 | 01001101111100001010 |
| 1  0  5  6 11 12 13 12 11  6  1 | 00011101111100001010 |
| 1  6  1  6 11 12 13 12 11  6  1 | 01100101111100001010 |
| 1  2  1  6 11 12 13 12 11  6  1 | 11000101111100001010 |
| 1  0  1  6 11 12 13 12 11  6  1 | 00110101111100001010 |
| 1  6 11 12  7 12 13 12 11  6  1 | 01011110011100001010 |
| 1  6  7 12  7 12 13 12 11  6  1 | 01110110011100001010 |
| 1  2  7 12  7 12 13 12 11  6  1 | 11010110011100001010 |
| 1  6  7  8  7 12 13 12 11  6  1 | 01111100011100001010 |
| 1  2  7  8  7 12 13 12 11  6  1 | 11011100011100001010 |
| 1  2  3  8  7 12 13 12 11  6  1 | 11110100011100001010 |
| 1  6 11  6  7 12 13 12 11  6  1 | 01011011011100001010 |
| 1  6  7  6  7 12 13 12 11  6  1 | 01110011011100001010 |
| 1  2  7  6  7 12 13 12 11  6  1 | 11010011011100001010 |
| 1  6  5  6  7 12 13 12 11  6  1 | 01001111011100001010 |
| 1  0  5  6  7 12 13 12 11  6  1 | 00011111011100001010 |
| 1  6  1  6  7 12 13 12 11  6  1 | 01100111011100001010 |
| 1  2  1  6  7 12 13 12 11  6  1 | 11000111011100001010 |
| 1  0  1  6  7 12 13 12 11  6  1 | 00110111011100001010 |
| 1  6  7  2  7 12 13 12 11  6  1 | 01111001011100001010 |
| 1  2  7  2  7 12 13 12 11  6  1 | 11011001011100001010 |
| 1  2  3  2  7 12 13 12 11  6  1 | 11110001011100001010 |
| 1  6  1  2  7 12 13 12 11  6  1 | 01101101011100001010 |
| 1  2  1  2  7 12 13 12 11  6  1 | 11001101011100001010 |
| 1  0  1  2  7 12 13 12 11  6  1 | 00111101011100001010 |

FIG. 8

| | | | | | | | | | | | |
|---|---|---|---|---|---|---|---|---|---|---|---|
| 1 | 6 | 11 | 12 | 13 | 8 | 13 | 12 | 11 | 6 | 1 | 0101111110010001010 |
| 1 | 6 | 7 | 12 | 13 | 8 | 13 | 12 | 11 | 6 | 1 | 0111011110010001010 |
| 1 | 2 | 7 | 12 | 13 | 8 | 13 | 12 | 11 | 6 | 1 | 1101011110010001010 |
| 1 | 6 | 7 | 8 | 13 | 8 | 13 | 12 | 11 | 6 | 1 | 0111110110010001010 |
| 1 | 2 | 7 | 8 | 13 | 8 | 13 | 12 | 11 | 6 | 1 | 1101110110010001010 |
| 1 | 2 | 3 | 8 | 13 | 8 | 13 | 12 | 11 | 6 | 1 | 1111010110010001010 |
| 1 | 6 | 7 | 8 | 9 | 8 | 13 | 12 | 11 | 6 | 1 | 0111111100010001010 |
| 1 | 2 | 7 | 8 | 9 | 8 | 13 | 12 | 11 | 6 | 1 | 1101111100010001010 |
| 1 | 2 | 3 | 8 | 9 | 8 | 13 | 12 | 11 | 6 | 1 | 1111011100010001010 |
| 1 | 2 | 3 | 4 | 9 | 8 | 13 | 12 | 11 | 6 | 1 | 1111110100010001010 |
| 1 | 6 | 11 | 12 | 7 | 8 | 13 | 12 | 11 | 6 | 1 | 0101111011010001010 |
| 1 | 6 | 7 | 12 | 7 | 8 | 13 | 12 | 11 | 6 | 1 | 0111011011010001010 |
| 1 | 2 | 7 | 12 | 7 | 8 | 13 | 12 | 11 | 6 | 1 | 1101011011010001010 |
| 1 | 6 | 7 | 8 | 7 | 8 | 13 | 12 | 11 | 6 | 1 | 0111110011010001010 |
| 1 | 2 | 7 | 8 | 7 | 8 | 13 | 12 | 11 | 6 | 1 | 1101110011010001010 |
| 1 | 2 | 3 | 8 | 7 | 8 | 13 | 12 | 11 | 6 | 1 | 1111010011010001010 |
| 1 | 6 | 11 | 6 | 7 | 8 | 13 | 12 | 11 | 6 | 1 | 0101101111010001010 |
| 1 | 6 | 7 | 6 | 7 | 8 | 13 | 12 | 11 | 6 | 1 | 0111001111010001010 |
| 1 | 2 | 7 | 6 | 7 | 8 | 13 | 12 | 11 | 6 | 1 | 1101001111010001010 |
| 1 | 6 | 5 | 6 | 7 | 8 | 13 | 12 | 11 | 6 | 1 | 0100111111010001010 |
| 1 | 0 | 5 | 6 | 7 | 8 | 13 | 12 | 11 | 6 | 1 | 0001111111010001010 |
| 1 | 6 | 1 | 6 | 7 | 8 | 13 | 12 | 11 | 6 | 1 | 0110011111010001010 |
| 1 | 2 | 1 | 6 | 7 | 8 | 13 | 12 | 11 | 6 | 1 | 1100011111010001010 |
| 1 | 0 | 1 | 6 | 7 | 8 | 13 | 12 | 11 | 6 | 1 | 0011011111010001010 |
| 1 | 6 | 7 | 2 | 7 | 8 | 13 | 12 | 11 | 6 | 1 | 0111100111010001010 |
| 1 | 2 | 7 | 2 | 7 | 8 | 13 | 12 | 11 | 6 | 1 | 1101100111010001010 |
| 1 | 2 | 3 | 2 | 7 | 8 | 13 | 12 | 11 | 6 | 1 | 1111000111010001010 |
| 1 | 6 | 1 | 2 | 7 | 8 | 13 | 12 | 11 | 6 | 1 | 0110110111010001010 |
| 1 | 2 | 1 | 2 | 7 | 8 | 13 | 12 | 11 | 6 | 1 | 1100110111010001010 |
| 1 | 0 | 1 | 2 | 7 | 8 | 13 | 12 | 11 | 6 | 1 | 0011110111010001010 |
| 1 | 6 | 7 | 8 | 3 | 8 | 13 | 12 | 11 | 6 | 1 | 0111111001010001010 |
| 1 | 2 | 7 | 8 | 3 | 8 | 13 | 12 | 11 | 6 | 1 | 1101111001010001010 |
| 1 | 2 | 3 | 8 | 3 | 8 | 13 | 12 | 11 | 6 | 1 | 1111011001010001010 |
| 1 | 2 | 3 | 4 | 3 | 8 | 13 | 12 | 11 | 6 | 1 | 1111110001010001010 |
| 1 | 6 | 7 | 2 | 3 | 8 | 13 | 12 | 11 | 6 | 1 | 0111101101010001010 |
| 1 | 2 | 7 | 2 | 3 | 8 | 13 | 12 | 11 | 6 | 1 | 1101101101010001010 |
| 1 | 2 | 3 | 2 | 3 | 8 | 13 | 12 | 11 | 6 | 1 | 1111001101010001010 |
| 1 | 6 | 1 | 2 | 3 | 8 | 13 | 12 | 11 | 6 | 1 | 0110111101010001010 |
| 1 | 2 | 1 | 2 | 3 | 8 | 13 | 12 | 11 | 6 | 1 | 1100111101010001010 |
| 1 | 0 | 1 | 2 | 3 | 8 | 13 | 12 | 11 | 6 | 1 | 0011111101010001010 |
| 1 | 6 | 11 | 12 | 13 | 12 | 11 | 12 | 11 | 6 | 1 | 0101111000110001010 |
| 1 | 6 | 7 | 12 | 13 | 12 | 11 | 12 | 11 | 6 | 1 | 0111011000110001010 |
| 1 | 2 | 7 | 12 | 13 | 12 | 11 | 12 | 11 | 6 | 1 | 1101011000110001010 |
| 1 | 6 | 7 | 8 | 13 | 12 | 11 | 12 | 11 | 6 | 1 | 0111110100011001010 |
| 1 | 2 | 7 | 8 | 13 | 12 | 11 | 12 | 11 | 6 | 1 | 1101110100011001010 |
| 1 | 2 | 3 | 8 | 13 | 12 | 11 | 12 | 11 | 6 | 1 | 1111010100011001010 |
| 1 | 6 | 11 | 12 | 11 | 12 | 11 | 12 | 11 | 6 | 1 | 0101110011001101010 |
| 1 | 6 | 7 | 12 | 11 | 12 | 11 | 12 | 11 | 6 | 1 | 0111010011001101010 |
| 1 | 2 | 7 | 12 | 11 | 12 | 11 | 12 | 11 | 6 | 1 | 1101010011001101010 |
| 1 | 6 | 11 | 10 | 11 | 12 | 11 | 12 | 11 | 6 | 1 | 0101001110011001010 |
| 1 | 6 | 5 | 10 | 11 | 12 | 11 | 12 | 11 | 6 | 1 | 0100011110011001010 |
| 1 | 0 | 5 | 10 | 11 | 12 | 11 | 12 | 11 | 6 | 1 | 0001011110011001010 |
| 1 | 6 | 11 | 6 | 11 | 12 | 11 | 12 | 11 | 6 | 1 | 0101100111001101010 |
| 1 | 6 | 7 | 6 | 11 | 12 | 11 | 12 | 11 | 6 | 1 | 0111000111001101010 |
| 1 | 2 | 7 | 6 | 11 | 12 | 11 | 12 | 11 | 6 | 1 | 1101000111001101010 |

FIG. 9

| | | | | | | | | | | |
|---|---|---|---|---|---|---|---|---|---|---|
| 1 | 6 | 5 | 6 | 11 | 12 | 11 | 12 | 11 | 6 | 1 | 0100110111001100101 0 |
| 1 | 0 | 5 | 6 | 11 | 12 | 11 | 12 | 11 | 6 | 1 | 0001110111001100101 0 |
| 1 | 6 | 1 | 6 | 11 | 12 | 11 | 12 | 11 | 6 | 1 | 0110010111001100101 0 |
| 1 | 2 | 1 | 6 | 11 | 12 | 11 | 12 | 11 | 6 | 1 | 1100010111001100101 0 |
| 1 | 0 | 1 | 6 | 11 | 12 | 11 | 12 | 11 | 6 | 1 | 0011010111001100101 0 |
| 1 | 6 | 11 | 12 | 7 | 12 | 11 | 12 | 11 | 6 | 1 | 0101111001001100101 0 |
| 1 | 6 | 7 | 12 | 7 | 12 | 11 | 12 | 11 | 6 | 1 | 0111011001001100101 0 |
| 1 | 2 | 7 | 12 | 7 | 12 | 11 | 12 | 11 | 6 | 1 | 1101011001001100101 0 |
| 1 | 6 | 7 | 8 | 7 | 12 | 11 | 12 | 11 | 6 | 1 | 0111110001001100101 0 |
| 1 | 2 | 7 | 8 | 7 | 12 | 11 | 12 | 11 | 6 | 1 | 1101110001001100101 0 |
| 1 | 2 | 3 | 8 | 7 | 12 | 11 | 12 | 11 | 6 | 1 | 1111010001001100101 0 |
| 1 | 6 | 11 | 6 | 7 | 12 | 11 | 12 | 11 | 6 | 1 | 0101101101001100101 0 |
| 1 | 6 | 7 | 6 | 7 | 12 | 11 | 12 | 11 | 6 | 1 | 0111001101001100101 0 |
| 1 | 2 | 7 | 6 | 7 | 12 | 11 | 12 | 11 | 6 | 1 | 1101001101001100101 0 |
| 1 | 6 | 5 | 6 | 7 | 12 | 11 | 12 | 11 | 6 | 1 | 0100111101001100101 0 |
| 1 | 0 | 5 | 6 | 7 | 12 | 11 | 12 | 11 | 6 | 1 | 0001111101001100101 0 |
| 1 | 6 | 1 | 6 | 7 | 12 | 11 | 12 | 11 | 6 | 1 | 0110011101001100101 0 |
| 1 | 2 | 1 | 6 | 7 | 12 | 11 | 12 | 11 | 6 | 1 | 1100011101001100101 0 |
| 1 | 0 | 1 | 6 | 7 | 12 | 11 | 12 | 11 | 6 | 1 | 0011011101001100101 0 |
| 1 | 6 | 7 | 2 | 7 | 12 | 11 | 12 | 11 | 6 | 1 | 0111100101001100101 0 |
| 1 | 2 | 7 | 2 | 7 | 12 | 11 | 12 | 11 | 6 | 1 | 1101100101001100101 0 |
| 1 | 2 | 3 | 2 | 7 | 12 | 11 | 12 | 11 | 6 | 1 | 1111000101001100101 0 |
| 1 | 6 | 1 | 2 | 7 | 12 | 11 | 12 | 11 | 6 | 1 | 0110110101001100101 0 |
| 1 | 2 | 1 | 2 | 7 | 12 | 11 | 12 | 11 | 6 | 1 | 1100110101001100101 0 |
| 1 | 0 | 1 | 2 | 7 | 12 | 11 | 12 | 11 | 6 | 1 | 0011110101001100101 0 |
| 1 | 6 | 11 | 12 | 11 | 10 | 11 | 12 | 11 | 6 | 1 | 0101110000111100101 0 |
| 1 | 6 | 7 | 12 | 11 | 10 | 11 | 12 | 11 | 6 | 1 | 0111010000111100101 0 |
| 1 | 2 | 7 | 12 | 11 | 10 | 11 | 12 | 11 | 6 | 1 | 1101010000111100101 0 |
| 1 | 6 | 11 | 10 | 11 | 10 | 11 | 12 | 11 | 6 | 1 | 0101001100111100101 0 |
| 1 | 6 | 5 | 10 | 11 | 10 | 11 | 12 | 11 | 6 | 1 | 0100011100111100101 0 |
| 1 | 0 | 5 | 10 | 11 | 10 | 11 | 12 | 11 | 6 | 1 | 0001011100111100101 0 |
| 1 | 6 | 11 | 6 | 11 | 10 | 11 | 12 | 11 | 6 | 1 | 0101100100111100101 0 |
| 1 | 6 | 7 | 6 | 11 | 10 | 11 | 12 | 11 | 6 | 1 | 0111000100111100101 0 |
| 1 | 2 | 7 | 6 | 11 | 10 | 11 | 12 | 11 | 6 | 1 | 1101000100111100101 0 |
| 1 | 6 | 5 | 6 | 11 | 10 | 11 | 12 | 11 | 6 | 1 | 0100110100111100101 0 |
| 1 | 0 | 5 | 6 | 11 | 10 | 11 | 12 | 11 | 6 | 1 | 0001110100111100101 0 |
| 1 | 6 | 1 | 6 | 11 | 10 | 11 | 12 | 11 | 6 | 1 | 0110010100111100101 0 |
| 1 | 2 | 1 | 6 | 11 | 10 | 11 | 12 | 11 | 6 | 1 | 1100010100111100101 0 |
| 1 | 0 | 1 | 6 | 11 | 10 | 11 | 12 | 11 | 6 | 1 | 0011010100111100101 0 |
| 1 | 6 | 11 | 10 | 5 | 10 | 11 | 12 | 11 | 6 | 1 | 0101001001111100101 0 |
| 1 | 6 | 5 | 10 | 5 | 10 | 11 | 12 | 11 | 6 | 1 | 0100011001111100101 0 |
| 1 | 0 | 5 | 10 | 5 | 10 | 11 | 12 | 11 | 6 | 1 | 0001011001111100101 0 |
| 1 | 6 | 11 | 6 | 5 | 10 | 11 | 12 | 11 | 6 | 1 | 0101100001111100101 0 |
| 1 | 6 | 7 | 6 | 5 | 10 | 11 | 12 | 11 | 6 | 1 | 0111000001111100101 0 |
| 1 | 2 | 7 | 6 | 5 | 10 | 11 | 12 | 11 | 6 | 1 | 1101000001111100101 0 |
| 1 | 6 | 5 | 6 | 5 | 10 | 11 | 12 | 11 | 6 | 1 | 0100110001111100101 0 |
| 1 | 0 | 5 | 6 | 5 | 10 | 11 | 12 | 11 | 6 | 1 | 0001110001111100101 0 |
| 1 | 6 | 1 | 6 | 5 | 10 | 11 | 12 | 11 | 6 | 1 | 0110010001111100101 0 |
| 1 | 2 | 1 | 6 | 5 | 10 | 11 | 12 | 11 | 6 | 1 | 1100010001111100101 0 |
| 1 | 0 | 1 | 6 | 5 | 10 | 11 | 12 | 11 | 6 | 1 | 0011010001111100101 0 |
| 1 | 6 | 5 | 0 | 5 | 10 | 11 | 12 | 11 | 6 | 1 | 0100100101111100101 0 |
| 1 | 0 | 5 | 0 | 5 | 10 | 11 | 12 | 11 | 6 | 1 | 0001100101111100101 0 |
| 1 | 6 | 1 | 0 | 5 | 10 | 11 | 12 | 11 | 6 | 1 | 0110000101111100101 0 |
| 1 | 2 | 1 | 0 | 5 | 10 | 11 | 12 | 11 | 6 | 1 | 1100000101111100101 0 |
| 1 | 0 | 1 | 0 | 5 | 10 | 11 | 12 | 11 | 6 | 1 | 0011000101111100101 0 |

METHOD AND DEVICE FOR CODE MODULATION, METHOD AND DEVICE FOR CODE DEMODULATION, AND METHOD AND DEVICE FOR DECODING

BACKGROUND OF THE INVENTION

1. Field of the Invention

This invention relates to a method and device for code modulation, method and device for code demodulation, and method and device for code decoding, and particularly relates to a method and device for code modulation, method and device for code demodulation, and method and device for code decoding suitably used for recording and reproducing audio data and video data in a recording media such as a disk or tape in a form of digital data.

2. Description of Related Art

High density recording of video and audio digital data in a recording media such as a magnetic disk, optical disc, magneto-optic disc, and magnetic tape is desirable. Usually, high density recording is realized using partial response (1, 0, −1) or partial response (1, 1). Higher density recording is realized using PRML (Partial Response Maximum Likelihood) that is a combination of partial response (1, 0, −1) or partial response (1, 1) with Viterbi decoding.

For example, in partial response (1, 0, −1) (abbreviated as PR4 hereinafter), assuming that the free squared Euclid distance (referred to as geometrical distance hereinafter) in the conventional peak (bit by bit) detection method is 1, then the geometrical distance for decoding can be 2 by performing Viterbi decoding. The larger geometrical distance can improve S/N ratio, and provide a means for additional high density recording. Further, PR4 allows the geometrical distance for Viterbi decoding to be 4 depending on the code modulation method.

For reproduction, for example, in order to suppress the generation of error due to the fluctuation of a reference level when a reproduction signal is converted to a binary code (digitized), or in order to suppress the generation of fluctuation in various error signals such as a tracking error signal in so-called servo control of a disk device or tape device, it is required to not include a direct current component in a modulation code.

Symbols of data [1] and [0] are represented by +1 and −1, then so-called DSV (Digital Sum Value), that is the grand total of symbols from the starting point of a modulation code train, is an index for evaluation of the above-mentioned direct current. A smaller absolute DSV represents a less direct current component or a low frequency component.

In modulations such as 8–10 modulation used for digital audio tape recorders (DAT), EFM (Eight to Fourteen Modulation) used for compact disc (CD) players, and Miller 2 (Miller Square) used for magnetic disk devices, DSV control is employed for reducing the absolute value of DSV, for example, after NRZI (Non Return Zero Inverted) that is so-called mark length modulation.

In PR4, DSV control may not be performed for reducing the absolute value of DSV of a modulation code train because PR4 has no direct current component in nature. But in partial response (1, 1) (abbreviated as PR1 hereinafter), DSV control should be performed to a modulation code train because PR1 a has direct current component by nature.

Further, application of a PRML system involves a problem of the length of path memory when Viterbi decoding is used. The path memory is a memory device for storing an estimated value of decode until the result of Viterbi decoding is established, and has a length proportional to the time length until the result is established. The time length until the establishment of the result, or the length of path memory, can be controlled dependent on the method for modulation coding. For example, the maximum value of the successive number of 1's in a modulation code train before NRZI modulation is the determinant of the required length of the path memory for application of 8–10 modulation code to PR1.

For a real device, it is not possible to provide an infinite path memory, and it is required to provide a path memory as short as possible in order to save cost and occupied space. A control for shortening the length of a path memory should be performed to a modulation code train.

In PR1 which has small spectrum in high frequencies and is suitable for high density recording in comparison with PR4, it is possible to simultaneously perform DSV control and the conversion of geometrical distance to 2 when decoding and to shorten the length of path memory by using the improved 8–10 modulated code proposed in the patent specification and drawings of U.S. patent application Ser. No. 08/309981 (Filing Date : Oct. 13, 1992) this applicant. The improved 8–10 modulation can not perform simultaneous DSV control and conversion of geometrical distance to 2 when decoding and can not shorten the length of path memory. This is disadvantageous. Though the geometrical distance when decoding can be 2, the geometrical distance when decoding can not be larger than 2. This is disadvantageous.

In order to solve the problem, the inventors of the present invention have proposed a code modulation method in which 3*3 states are located in the space of a transition diagram composed of the first axis and second axis. A code [00] is assigned for transition from a certain state to another state along the first axis in the first direction. A code [11] is assigned for transition from a certain state to another state along the first axis in the second direction opposite to the first direction. A code [01] is assigned for transition from a certain state to another state along the second axis in the third direction. A code [10] is assigned for transition from a certain state to another sate along the second axis in the fourth direction opposite to the third direction to generates a 12-bit code. The 12-bit code is assigned to 8-bit data correspondingly. Thereby a 8-bit data is converted to a 12-bit code. This proposed code modulation method and code demodulation method are described in the patent specification and drawings of U.S. patent application Ser. No. 08/579,002 (Filing Date: Dec. 27, 1995). (Japanese Patent Application corresponding to this application is not yet published when this application was filed in the U.S.A. Therefore, the application is described herein only for reference to an examiner)

However, this method performs not so high of conversion efficiency because this method is a method for converting a 8-bit data to a 12-bit code. This method is still not sufficient in the aspect of high density recording and reproduction.

SUMMARY OF THE INVENTION

In view of the above-mentioned status, it is the object of the present invention to provide a method and device for conversion efficiency and for performing high density recording and reproduction by simultaneous DSV controlling and increasing geometrical distance, shortening the path memory, and converting a 16-bit data to a 20-bit code.

A code modulation method for converting a 16-bit data to a 20-bit code in accordance with the present invention comprises the first step for receiving the 16-bit data and the second step for generating the 20-bit code corresponding to the 16-bit data, wherein the 20-bit code is a code generated according to the state transition diagram composed of P×Q states, in the state transition diagram, P×Q states are arranged on the space having the first axis and second axis, the code of 00 is assigned when the state transits from a certain state to another state along the first axis in the first direction, the code of 11 is assigned when the state transits from a certain state to another state along the first axis in the second direction opposite to the first direction, the code of 01 is assigned when the state transits from a certain state to another state along the second axis in the third direction, the code of 10 is assigned when the state transits from a certain state to another state along the second axis in the fourth direction opposite to the third direction, and the 20-bit code comprises the combination of codes respectively assigned to the transition of the states.

A code modulation device for converting a 16-bit data to a 20-bit code in accordance with the present invention comprises a receiving means for receiving the 16-bit data, and a generation means for generating the 20-bit code corresponding to the 16-bit data, wherein the 20-bit code is a code generated according to the state transition diagram composed of P×Q states, in the state transition diagram, P×Q states are arranged on the space having the first axis and second axis, the code of 00 is assigned when the state transits from a certain state to another state along the first axis in the first direction, the code of 11 is assigned when the state transits from a certain state to another state along the first axis in the second direction opposite to the first direction, the code of 01 is assigned when the state transits from a certain state to another state along the second axis in the third direction, the code of 10 is assigned when the state transits from a certain state to another state along the second axis in the fourth direction opposite to the third direction, and the 20-bit code comprises the combination of codes respectively assigned to the transition of the states.

A code demodulation method for converting a 20-bit code to 16-bit data in accordance with the present invention comprises the first step for receiving the 20-bit code and the second step for generating 16-bit data corresponding to the 20-bit code, wherein the 20-bit code is any one of codes generated according to the state transition diagram composed of P×Q states, in the state transition diagram, P×Q states are arranged on the space having the first axis and second axis, the code of 00 being assigned when the state transits from a certain state to another state along the first axis in the first direction, the code of 11 is assigned when the state transits from a certain state to another state along the first axis in the second direction opposite to the first direction, the code of 01 is assigned when the state transits from a certain state to another state along the second axis in the third direction, the code of 10 is assigned when the state transits from a certain state to another state along the second axis in the fourth direction opposite to the third direction, and the 20-bit code comprises the combination of codes respectively assigned to the transition of the states.

A code demodulation device for converting a 20-bit code to 16-bit data in accordance with the present invention comprises a means for receiving the 20-bit code and a generation means for generating a 16-bit data corresponding to the 20-bit code, wherein the 20-bit code is any one of codes generated according to the state transition diagram composed of P×Q states, in the state transition diagram, P×Q states are arranged on the space having the first axis and second axis, the code of 00 is assigned when the state transits from a certain state to another state along the first axis in the first direction, the code of 11 is assigned when the state transits from a certain state to another state along the first axis in the second direction opposite to the first direction, the code of 01 is assigned when the state transits from a certain state to another state along the second axis in the third direction, the code of 10 is assigned when the state transits from a certain state to another state along the second axis in the fourth direction opposite to the third direction, and the 20-bit code comprises the combination of codes respectively assigned to the transition of the states.

A code decoding method in accordance with the present invention comprises, the first step for receiving a supplied 20-bit code, the 20-bit code is a code generated according to the state transition diagram composed of P×Q (both P and Q are positive integers) states, in the state transition diagram, P×Q states are arranged on the space having the first axis and second axis, the code of 00 is assigned when the state transits from a certain state to another state along the first axis in the first direction, the code of 11 is assigned when the state transits from a certain state to another state along the first axis in the second direction opposite to the first direction, the code of 01 is assigned when the state transits from a certain state to another state along the second axis in the third direction, the code of 10 is assigned when the state transits from a certain state to another state along the second axis in the fourth direction opposite to the third direction, and the 20-bit code comprises the combination of codes respectively assigned to the transition of the states (the first step), the second step for providing inter-code interference due to partial response (1, 1) characteristics, and the third step for decoding the 20-bit code provided with the inter-code interference in the second step using Viterbi decoding, in the third step, the Viterbi decoding is performed according to the state transition diagram composed of 2×Q states, in the state transition diagram, 2×Q demodulation states are arranged along the third axis and forth axis, the code of 00 is generated when the state transits from a certain demodulation state to another demodulation state along the third axis in the fifth direction and the sampling value of 0−1 is supplied, the code of 11 is generated when the state transits from a certain demodulation state to another demodulation state along the third axis in the sixth direction opposite to the fifth direction and the sampling value of 0+1 is supplied, the code of 01 is generated when the state transits from a certain demodulation state to another demodulation state along the fourth axis in the seventh direction and the sampling value of 00 is supplied, the code of 10 is generated when the state transits from a certain demodulation state to another demodulation state along the fourth axis in the eighth direction opposite to the seventh direction and the sampling value of 00 is supplied, the code of 10 is generated when the state transits from a certain demodulation state to another demodulation state in the ninth direction along the sixth axis intersecting the third axis and fourth axis and the sampling value of +10 is supplied, the code of 01 is generated when the state transits from a certain demodulation state to another demodulation state in the tenth direction opposite to the ninth direction along the sixth axis and the sampling value of −10 is supplied, the code of 00 is generated when the state transits from the demodulation state disposed in the fifth direction to the demodulation state and the sampling value of −1−1 is supplied in the demodulation state arranged in a form of a pair in the fifth direction and sixth direction, and the code of 11 is generated when the state transits from the demodulation state disposed in the sixth direction to the demodulation state and the sampling value of 11 is supplied in the demodulation state arranged in a form of a pair in the fifth direction and sixth direction.

A code decoding device in accordance with the present invention comprises, means for receiving a supplied 20-bit code, the 20-bit code is a code generated according to the state transition diagram composed of P×Q (both P and Q are positive integers) states, in the state transition diagram, P×Q states are arranged on the space having the first axis and second axis, the code of 00 is assigned when the state transits from a certain state to another state along the first axis in the first direction, the code of 11 is assigned when the state transits from a certain state to another state along the first axis in the second direction opposite to the first direction, the code of 01 is assigned when the state transits from a certain state to another state along the second axis in the third direction, the code of 10 is assigned when the state transits from a certain state to another state along the second axis in the fourth direction opposite to the third direction, and the 20-bit code comprises the combination of codes respectively assigned to the transition of the states, means for providing inter-code interference due to partial response (1, 1) characteristics, and decoding means for decoding the 20-bit code provided with the inter-code interference by the inter-code interference means using Viterbi decoding, in the decoding means, the Viterbi decoding is performed according to the state transition diagram composed of 2×Q states, in the state transition diagram, 2×Q demodulation states are arranged along the third axis and forth axis, the code of 00 is generated when the state transits from a certain demodulation state to another demodulation state along the third axis in the fifth direction and the sampling value of 0−1 is supplied, the code of 11 is generated when the state transits from a certain demodulation state to another demodulation state along the third axis in the sixth direction opposite to the fifth direction and the sampling value of 0+1 is supplied, the code of 01 is generated when the state transits from a certain demodulation state to another demodulation state along the fourth axis in the seventh direction and the sampling value of 00 is supplied, the code of 10 is generated when the state transits from a certain demodulation state to another demodulation state along the fourth axis in the eighth direction opposite to the seventh direction and the sampling value of 00 is supplied, the code of 10 is generated when the state transits from a certain demodulation state to another demodulation state in the ninth direction along the sixth axis intersecting the third axis and fourth axis and the sampling value of +10 is supplied, the code of 01 is generated when the state transits from a certain demodulation state to another demodulation state in the tenth direction opposite to the ninth direction along the sixth axis and the sampling value of 10 is supplied, the code of 00 is generated when the state transits from the demodulation state disposed in the fifth direction to the demodulation state and the sampling value of −1−1 is supplied in the demodulation state arranged in a form of a pair in the fifth direction and sixth direction, and the code of 11 is generated when the state transits from the demodulation state disposed in the sixth direction to the demodulation state and the sampling value of 11 is supplied in the demodulation state arranged in a form of a pair in the fifth direction and sixth direction.

BRIEF DESCRIPTION OF THE DRAWINGS

FIG. 7 is a diagram for describing an example of codes generated according to the state transition diagram of FIG. 5.

FIG. 8 is a diagram for describing an example of codes generated according to the state transition diagram of FIG. 5.

FIG. 9 is a diagram for describing an example of codes generated according to the state transition diagram of FIG. 5.

DETAILED DESCRIPTION OF PREFERRED EMBODIMENTS

Figure 1:
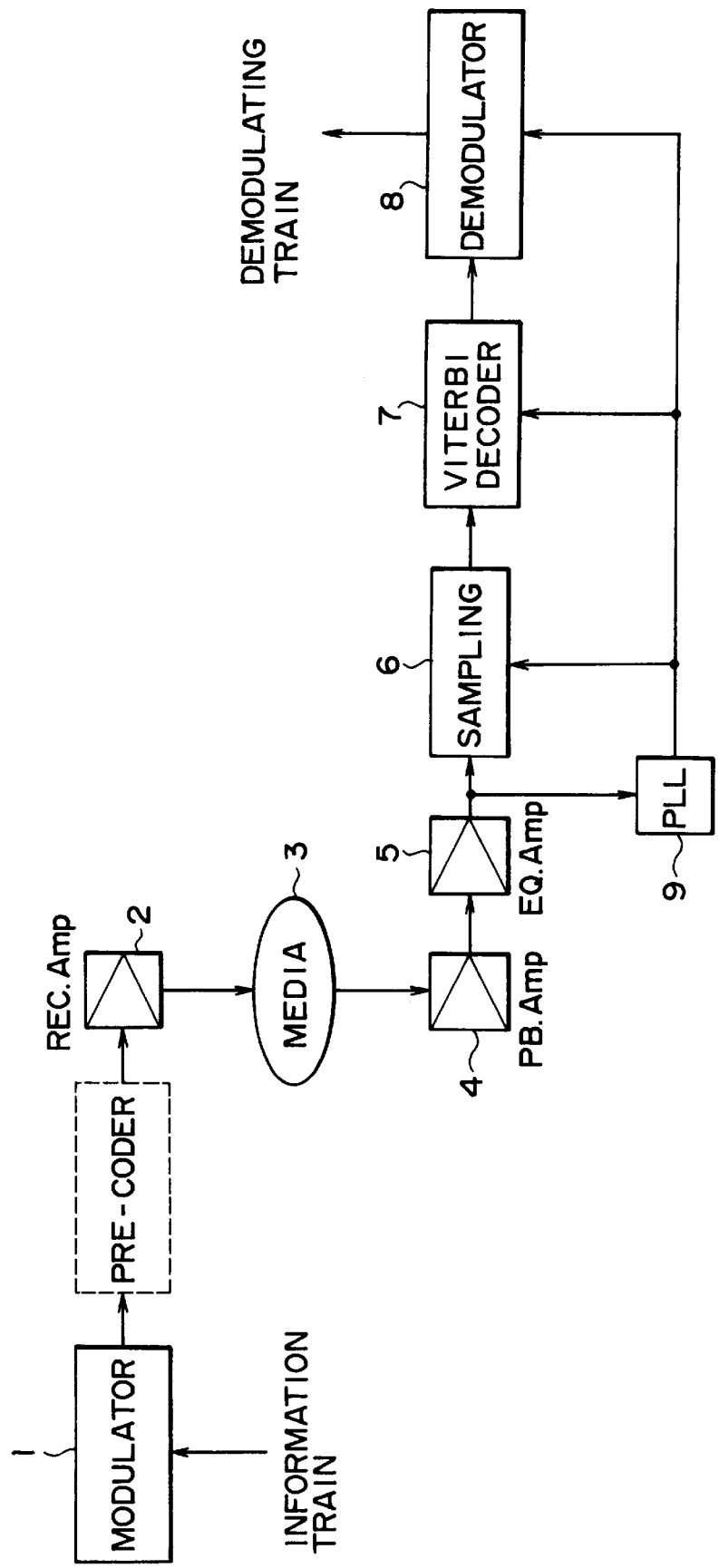
FIG. 1 is a block diagram for illustrating an embodiment of a recording and reproducing device employing the code modulation method and code demodulation method in accordance with the present invention.

FIG. 1 is a block diagram for illustrating a structure of an embodiment of a recording and reproducing device employing the code modulation method and code demodulation method in accordance with the present invention.

In the recording side, a modulator 1 converts information train (16-bit digital data) to be recorded in a media 3 such as optical disc, magneto-optical disc, magnetic disk, or magnetic tape to a 20-bit code and outputs it to a recording amplifier 2.

Figure 2:
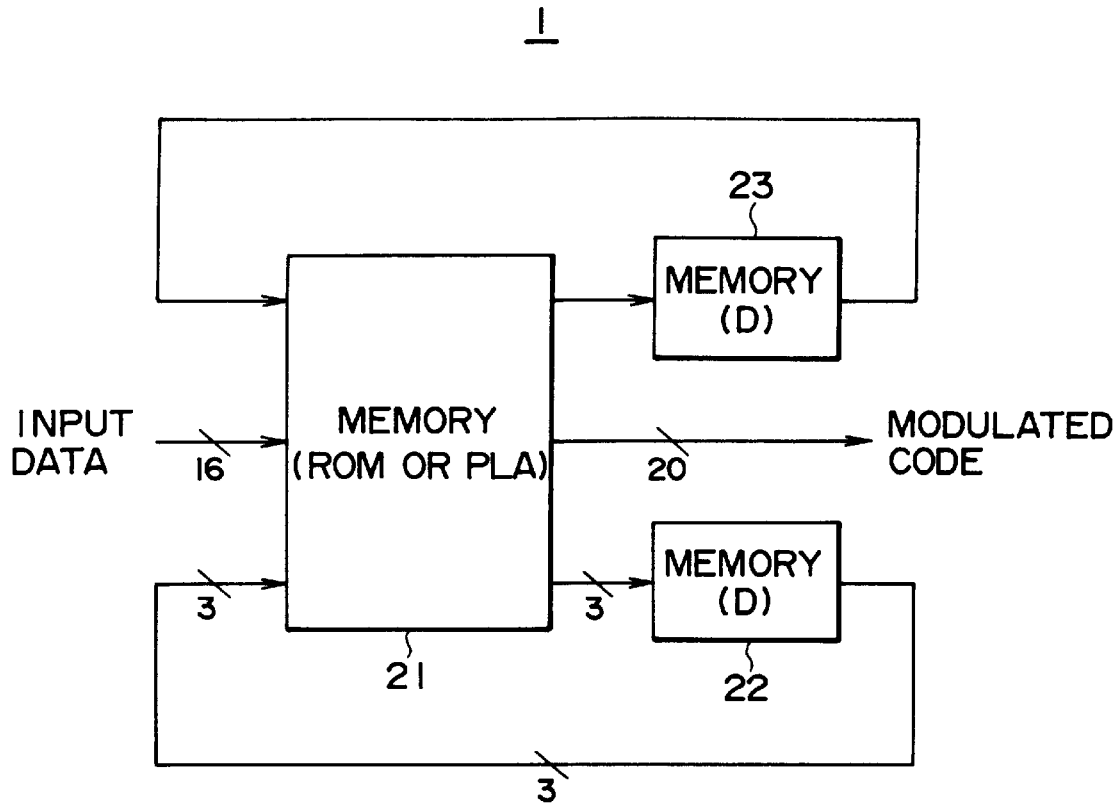
FIG. 2 is a block diagram for illustrating a structural example of the modulator 1 in FIG. 1.

The modulator 1 comprises, for example as shown in FIG. 2, a memory 21 such as ROM (Read Only Memory) or PLA (Programmable Logic Array), memory 22 such as register, and memory 23.

The recording amplifier 2 amplifies data supplied from the modulator 1, and the amplified data is recorded in the media 3 through a pick-up device or head device (not shown in the figure).

In the regenerator side, a reproducing amplifier 4 amplifies and reproduces data in the media 3 detected by a certain pick-up device or head device (not shown in the figure), and outputs it to an equalizer amplifier 5. The equalizer amplifier 5 equalizes data supplied from the reproducing amplifier 4 and then outputs it to a sampling circuit 6 and PLL circuit 9.

The sampling circuit 6 samples a reproducing signal of the media 3 supplied from the equalizer amplifier 5 and outputs the sampled value to a Viterbi decoder 7.

The Viterbi decoder 7 decodes a sampled value (three values: −1, 0, +1) supplied from the sampling circuit 6 and outputs the resultant code (20-bit code (binary code: 0, 1)) to a demodulator 8.

The PLL circuit 9 generates a clock signal from a reproducing signal supplied from the equalizer amplifier 5 and outputs it to the sampling circuit 6, Viterbi decoder 7, and demodulator 8.

Figure 3:
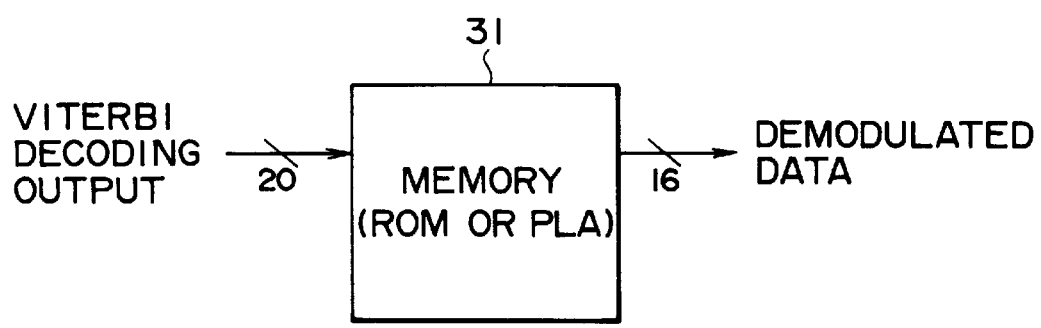
FIG. 3 is a block diagram for illustrating a structural example of the demodulator 8 in FIG. 1.

The demodulator 8 comprises, for example as shown in FIG. 3, a memory 31 such as ROM or PLA, demodulates a 20-bit code supplied from the Viterbi decoder 7 to the original 16-bit digital data by referring to a desired table.

In this embodiment, a pre-coder is provided in the recording side.

Figure 4:
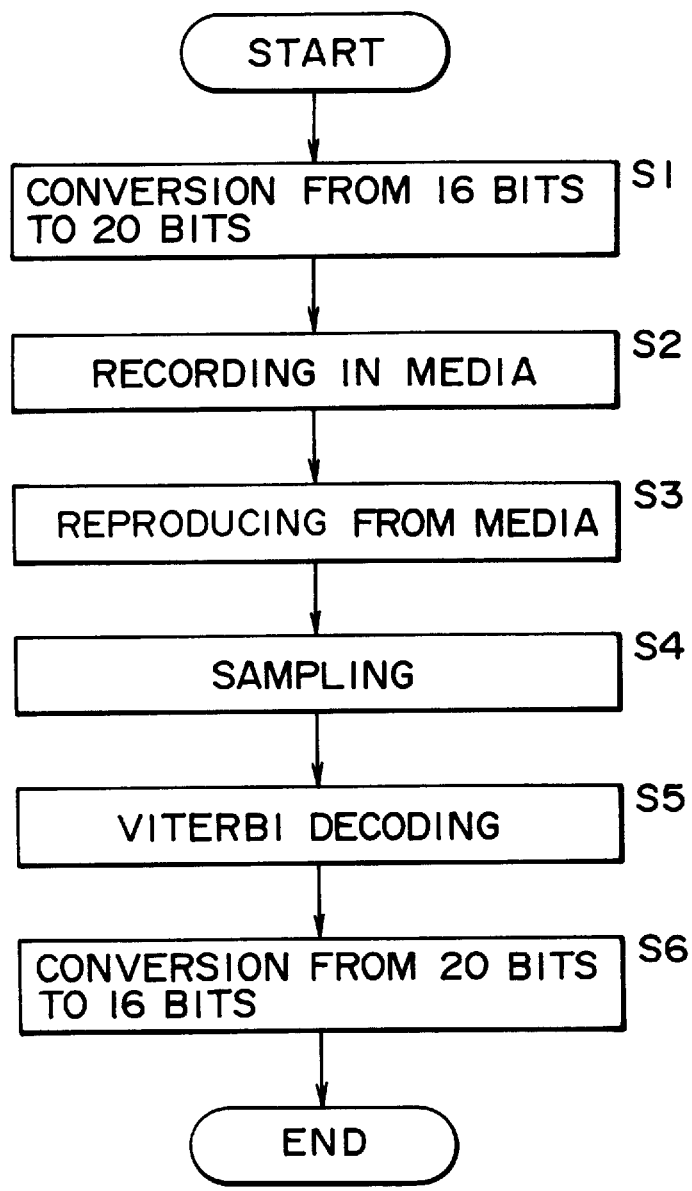
FIG. 4 is a flow chart for describing the operation of the embodiment of FIG. 1.

Next, the operation of this embodiment is described referring to the flow chart of FIG. 4.

First, 16-bit digital data supplied to the memory 21 of the modulator 1 are converted to 20-bit codes according to a conversion table stored in the memory 21 in the step S1. The conversion table stored in the memory 21 was generated according to the state transition diagram shown in FIG. 5, and correlates 20-bit codes to 16-bit digital data. The state used in FIG. 5 has no relationship to the state shown in FIG. 10 that will be described hereinafter.

Figure 5:
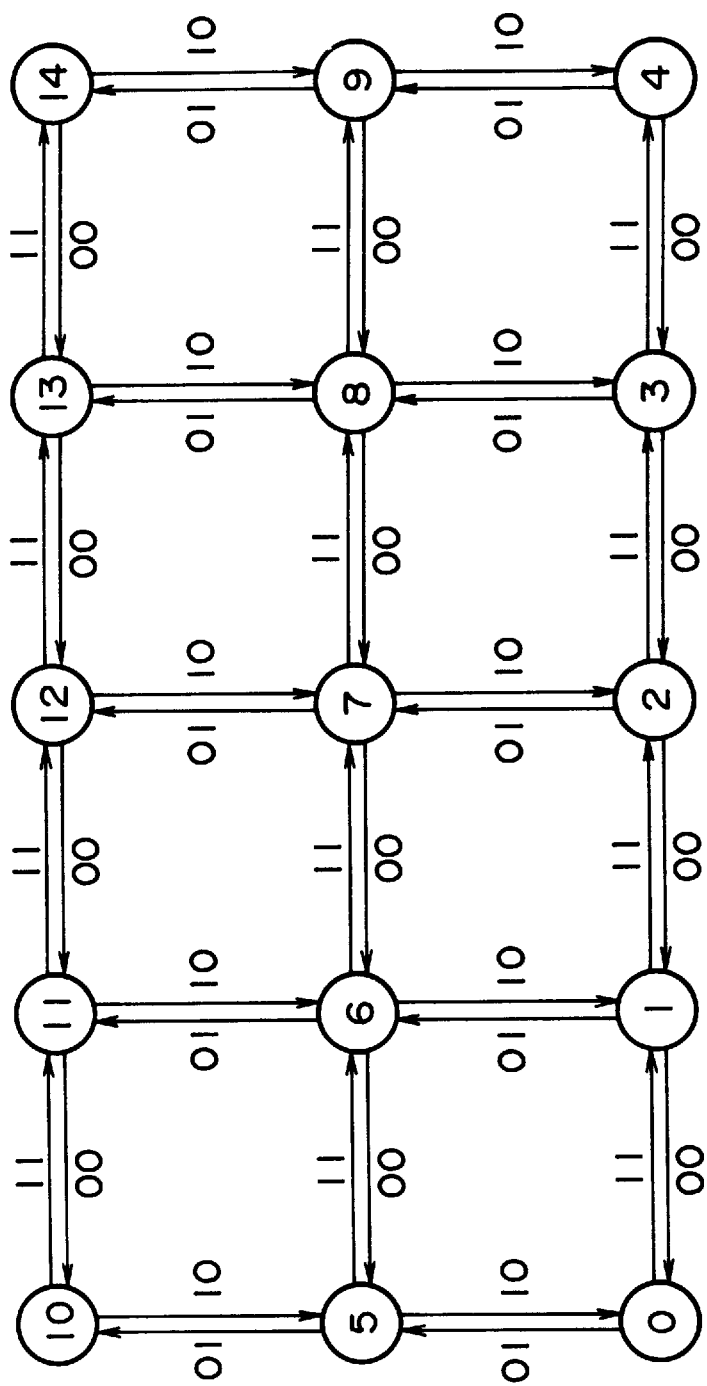
FIG. 5 is a diagram for describing the state transition for code generation.

In this embodiment, 15 states (state 0 to state 14) are arranged in a form of 5*3 matrix as shown in FIG. 5, and 20-bit codes are generated using the system arranged in a form of a matrix. In this system, a 2-bit data 11 is assigned to a transition in the right direction for the transition of respective states along the horizontal axis, and a 2-bit data 00 is assigned to a transition in the left direction. A 2-bit data 01 is assigned to a transition in the upward direction and a 2-bit data 10 is assigned to a transition in the downward direction for the transition of respective states along the vertical axis.

In FIG. 5, the horizontal direction is the direction that controls a DC component in a code. The horizontal direction has no relationship to Viterbi decoding that will be described hereinafter. The vertical direction is the direction for controlling energy of ½ frequency component of a recording rate in a code. The vertical direction closely relates to Viterbi and is the determinant for determining the geometrical distance of a code.

A 10 times starting point state transition of a prescribed transition generates a 20-bit code (once transition corresponds to 2 bits).

In this embodiment, the starting point is any one of odd number states of state 1, state 3, state 5, state 7, state 9, state 11 and state 13 out of 15 states. All odd number states (state 1, state 3, state 5, state 7, state 9, state 11, and state 13) being the starting point is more advantageous than partial even number states (state 0, state 4, state 10, and state 14) being the starting point in that the more number transferable to other states are available and more codes are easily generated.

Accordingly, the transition starts from any one of odd number states of state 1, state 3, state 5, state 7, state 9, state 11, and state 13, proceeds through 9 arbitrary states adjacent each other successively from the starting point, and ends at any one of odd number states of state 1, state 3, state 5, state 7, state 9, state 11, and state 13, and thus 10 times state transition generates a 20-bit code corresponding to respective transitions. The resultant 20-bit data is to be stored in the memory 21. Such transition having the starting point of an odd number state results in the end point of an odd number state because the number of transitions is an even number (10 times). The starting point for transition is selected arbitrarily from the group of odd number states.

For example, in the case that the transition proceeds from the state 1 to the state 1 through the state 6, state 11, state 12, state 13, state 14, state 13, state 12, state 11, and state 6, then the 20-bit code corresponding to the transition is 01, 01, 11, 11, 11, 00, 00, 00, 00, 10, and 10.

The 20-bit code corresponding to the transition from a certain starting point to the certain end point through 9 states are the code that is available as a code after conversion. Specifying a certain state transition with a certain 16-bit output data allows the 16-bit data to be converted to a 20-bit code.

It is necessary to successively perform such state transition so that a path is determined with holding a certain geometrical distance when decoding. The state of ending point of each code becomes the state of starting point of the next code. It is required to be possible to generate at least 216 codes so that the respective starting points are acceptable of any one of 16-bit input data.

If the Viterbi decoder has an infinite path memory, a 20-bit code generated as described herein above is all usable as a code after conversion. However, an infinite path memory can not be provided actually. The memory length is desirably as small as possible in view of the cost and occupied space.

Only the 20-bit code out of 20-bit codes generated as described herein above that satisfies a certain condition may be actually usable for data conversion because of restriction of memory (path memory) usable for processing in the Viterbi decoder 7.

Figure 6:
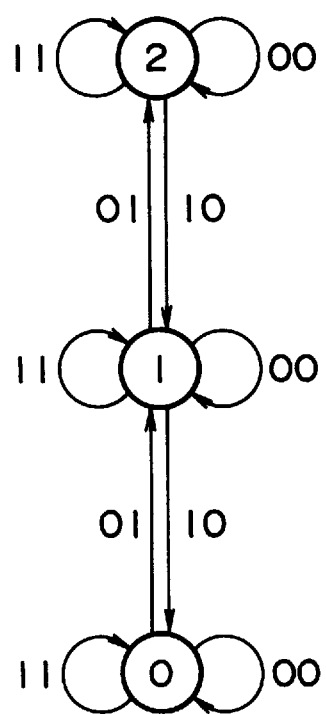
FIG. 6 is a diagram for describing the state transition without restriction on the horizontal axis in FIG. 5.

For example, the state transition as shown in FIG. 6 is referred. FIG. 6 is a state transition diagram expressing FIG. 5 with only the state used for determination of the geometrical distance. The reason why only vertical transition in FIG. 5 may taken into consideration as shown in FIG. 6 is attributed to the fact that the horizontal transition in FIG. 5 has no relationship to the length of a path memory, and in such PR (1, 1) the horizontal transition has no relationship to the path memory when the Viterbi decoding is used. In such system, a code having a path that starts from the state 0 and transits only between the state 1 and having a path that starts from the state 1 and transits only between the state 2 is considered. If the transit continues so that one path transits to the one step upper level, the other path correspondingly transits to the one step upper level, and one path remains in the same state, the other path correspondingly remains the same state, then the two paths (parallel path) will not merge together. Such transit will not result in the unified path. It means an infinite path memory.

However, it is actually required to use a finite path memory for the Viterbi decoder 7 as described herein above, and it is desirable to use a path memory as small as possible in view of the cost. If such state transition continues infinitely, then the Viterbi decoder 7 can not determine the decode result, exhausts the finite path memory, and can not decode the data. To avoid such trouble, the path that requires an infinite path memory should be removed previously. A certain condition for finite path memory is postulated, only the data that satisfies the condition out of generated data are used as codes after conversion.

The condition for finite path memory is, for example, the passage through the state 0 and state 2 once, respectively. The shorter time length for passing the state 0 and state 2 results in the shorter memory length.

Code generation in which DSV and geometrical distance are considered is described referring to a state transition diagram of FIG. 5.

The horizontal axis in FIG. 5 represents DSV (Digital Sum Value) as described herein above. In detail, the code 0 corresponds to −1, +1 is assigned to the code 1, and the sum of +1 and −1 assigned to the generated codes is operated arithmetically. For example, if the state 1 transits to the state 0 and the state 0 returns to the state 1, then the code for transit from the state 1 to the state 0 is 00, and DSV is −2 (=−1+−1). However, the code is 11 for returning from the state 0 to the state 1, then DSV is 2 (=1+1), and the total DSV is 0 (=−2+2). The code for transit from the state 1 to the state 2 is 11, then DSV is +2, and the code for returning from the state 2 to the state 1 is −2, then DSV is 0 when returning to the state 1. Similarly, for the transition between the state 2 and the state 3 and the transition between the state 3 and the state 4, DSV is 0 when returning to the original state.

For the transition in which the state 1 transits to the state 0 and then the state 0 transits to the state 5, the code is 00 for the transition from the state 1 to the state 0, then DSV is −2. The code is 01 for transit from the state 0 to the state 5, then DSV is 0 (=+1−1) for this transition. DSV is therefore −2 at the time point when transition to the state 5.

For the transition of the state along the vertical axis, the code assigned to the transition is 01 or 10, DSV is consequently 0. In other words, the transition of the state in the vertical direction results in unchanged DSV. Accordingly, DSV changes only when the state transits along the vertical direction, and states on the same horizontal line have the same DSV.

In the embodiment described herein above, the maximum and minimum value of DSV are +5 and −5 respectively assuming that DSV of the state 2, state 7, and state 12 is 0. This value occurs during a way of transition.

In detail, for example, DSV is +4 (=−2+2+2+2) for the transition from the state 11 to the state 14 through the state 12 and state 13. DSV is +3 for the transition from the state 14 to the state 9 at the timing when +1 is added corresponding to the code 1 out of codes 10. However, when the transit proceeds to the state 9, −1 corresponding to codes 10 is added as DSV to ultimately result in DSV of +4.

Further, for example, during transition from the state 3 to the state 5 through the state 2, state 1, and state 0, DSV is −4 (=+2−2−2−2) correspondingly to code 00 of respective transitions for the transition from the state 3 to the state 0 through the state 2 and state 1. DSV temporarily becomes −3 because −1 is added correspondingly to code 0 out of codes 01 when the state transits from the state 0 to the state 5. However, +1 is ultimately added to DSV correspondingly to the residual code 0 out of the codes 01 when the state is settled in the state 5 to result in the ultimate DSV of −4.

Accordingly, as it is obvious from the embodiment described herein above, the number of states in the horizontal direction in FIG. 5 is prescribed to be finite, thereby the generation of direct current component in the code is prevented. In other words, infinite continuation of 00 or 11 is prevented (at most ten continuous 0's or 1's). The frequency of 00 and 11 is equalized, and the generation of a direct current component in the code is thus prevented.

On the other hand, the finite number of states in the vertical direction in the modulator 1 results in 0 energy of ½ frequency component of the channel rate fch (transmission rate). In other words, the assignment of the vertical code to 01 or 10 equalizes the frequency of 01 and 10 to be the same, and thus the geometrical distance when decoding is made large and the resistance to noise is improved.

As described herein above, a 20-bit code generated from the starting point of an odd state number is used as a conversion code corresponding to the state transition diagram shown in FIG. 5. Further, by selecting a code that satisfies the condition described hereinafter out of the codes, the length (truncation depth) that is capable of unifying the path is allowed to be within 4 code length (40 bits).

The code that is generated in consideration of the above-mentioned DSV and geometrical distance and additionally in consideration of the path memory is described herein after.

In order to prescribe the memory length used in the path memory to be finite, the condition A "finite code length, passage through any one of the state 0, state 1, state 2, state 3, and state 4, and passage through any one of the state 10, state 11, state 12, state 13, and state 14" is postulated.

20-bit codes that are capable of satisfying the condition A within 4 code length are prepared in the number of types of 16-bit data (216) for states of each starting point. The code has a code length as short as possible to shorten the memory length of the path memory as short as possible and satisfies the condition A.

For example, codes that satisfy the condition A with only the code (single code) out of codes starting from the state 7 exist 216 or more. 216 codes are selected from such codes and used for data conversion as codes that starts from the state 7. The selected 216 codes that start from the state 7 satisfy the condition A with only a single code, the path is therefore unified within one code length from the starting of the code.

Codes that satisfy the condition A with only a single code out of codes starting from any one of the state 1, state 3, state 11, and state 13 exist in the number less than 216. Then, out of codes starting from any one of the state 1, state 3, state 11, and state 13, the codes that satisfy the condition B "ending state is the state 7, and does not satisfy the condition A with only a single code" are also used to prepare 216 codes.

In the code that satisfies such condition B, the state transits from any one of the state 1, state 3, state 11, and state 13 to the state 7, the path is thereafter unified in the next code starting from the state 7, and thus the path is unified within 2 code length from the starting point of the code that starts from any one of the state 1, state 3, state 11, and state 13.

Codes that satisfy the condition A with only a single code or satisfy the condition B with only a single code out of codes starting from the state 5 or the state 9 exist in the number less than 216, then the codes that satisfy the condition C "the state of the end point is any one of the state 1, state 3, state 7, state 11, and state 13, and does not satisfy the condition A with only a single code" are used further.

In the code that satisfies such condition C, the state transits from the state 5 or state 9 to any one ending point of the state 1, state 3, state 11 and state 13, subsequently in the next code starting from any one starting point of the state 1, state 3, state 11, and state 13, the state transits to the ending point of the state 7, and further the path is unified in the next code starting from the state 7, and therefore the path is totally unified within 3 code length from the starting point of the code starting from the state 5 or state 9. When the state transits from the starting point of the state 5 or the state 9 to the ending point of the state 7, the path is unified in the next code, and therefore the path is unified within 2 code length.

If codes that satisfy the condition C are used, the number of codes that satisfy the condition A within 4 codes out of codes starting from the starting point of the state 5 or state 9 is less than 216, then codes that satisfy the condition D "the state of ending point is the state 5 or state 9, and does not satisfy the condition A with only a single code, and satisfy any one of following condition E, condition F, and condition G" are also used to prepare 216 codes.

The conditions E to G are described herein after.

The condition E is "previous codes do not pass any one of the state 0, state 1, state 2, state 3, and state 4, and current codes pass any of the state 0, state 1, state 2, state 3, and state 4 and do not pass any one of the state 10, state 11, state 12, state 13, and state 14"

The condition F is "previous codes do not pass any one of the state 10, state 11, state 12, state 13, and state 14, and current codes pass any of the state 10, state 11, state 12, state 13, and state 14, and do not pass any one of the state 0, state 1, state 2, state 3, and state 4."

The condition G is "previous codes satisfy the condition A with only a single code, and current codes pass any of the state 10, state 11, state 12, state 13, and state 14, or pass any of the state 0, state 1, state 2, state 3, and state 4."

By specifying the conditions E to G as described herein above, continuous staying of the path on the state 5 or state 9 and no infinite unification of the path due to reciprocation between the state 5 and state 9 are prevented, and the path is unified at most within 4 code length from the starting point of the code starting from the state 5 or state 9 (for example, if the state transits from the state 5 or the state 9 to the state 5 or the state 9 in the first code, transits to the state 1, state 3, state 7, or state 11 in the second code, and transits to the state 7 in the third code, and the path is unified in the fourth code, then the code length for the unification of the path is at most 4).

By applying the conditions E to G, two 20-bit codes (one of the codes satisfy the condition E (path set G1) and one of the codes satisfy the condition F (path set G2)) are previously assigned to one 16-bit data, these two codes are used selectively dependent on the preceding adjacent 16-bit data (if the condition G is satisfied, any one of two codes is used).

For example, a 20-bit code of "10111111110100000000" (state transition from the state 5 to the state 5 through the state 0, state 1, state 2, state 3, state 4, state 9, state 8, state 7, and state 6) of the path set G1 and a 20-bit code of "01111111111000000000" (state transition from the state 5 to the state 5 through the state 10, state 11, state 12 state 13, state 14, state 9, state 8, state 7, and state 6) of the path set G2 are assigned to a certain 16-bit data, these codes are used selectively dependently-on the data path (passage of the state transition) of the preceding adjacent 16-bit data X.

As described herein above, the code is selected so that the path is unified at longest within 4 code length, and $2^{16}$ codes are prepared correspondingly to the state of each starting point.

The path memory of 5 code length (100 bits) is sufficient because the path starts on the way of the code in which the path is unified, and the path is unified at most within 4 code length from the starting point of the next code. For example, the state transits from the state 3 to the state 9 in the first code, and the path is unified during the transition. Next, the state transits from the state 9 to the state 5 in the second code, and the state transits from the state 5 to the state 11 in the third code. Then, the state transits from the state 11 to state 7 in the fourth code. Further, the state transits from the state 7 to the state 1 in the fifth code, and the path is unified again during this transition. The path memory stores the codes from the first code to fifth code because parallel path continues from the half way of the first code to the half way of the fifth code.

The above-mentioned condition A to condition G are summarized for conditions of each starting point and ending point as described herein under. In (i-j) described herein under, i represents the state of starting point and j represents the state of ending point.

(1-1) The code with the starting point of the state 1 and the ending point of the state 1 is selected from codes which pass any one of the state 10, state 11, state 12, state 13, and state 14.

(1-3) The code with the starting point of the state 1 and the ending point of the state 3 is selected from codes which pass any one of the state 10, state 11, state 12, state 13, and state 14.

(1-5) The code with the starting point of the state 1 and the ending point of the state 5 is selected from codes which pass any one of the state 10, state 11, state 12, state 13, and state 14.

(1-7) The code with the starting point of the state 1 and the ending point of the state 7 is selected from codes which pass an arbitrary state.

(1-9) The code with the starting point of the state 1 and the ending point of the state 9 is selected from codes which pass any one of the state 10, state 11, state 12, state 13, and state 14.

(1-11) The code with the starting point of the state 1 and the ending point of the state 11 is selected from codes which pass an arbitrary state.

(1-13) The code with the starting point of the state 1 and the ending point of the state 13 is selected from codes which pass an arbitrary state.

(3-1) The code with the starting point of the state 3 and the ending point of the state 1 is selected from codes which pass any one of the state 10, state 11, state 12, state 13, and state 14.

(3-3) The code with the starting point of the state 3 and the ending point of the state 3 is selected from codes which pass any one of the state 10, state 11, state 12, state 13, and state 14.

(3-5) The code with the starting point of the state 3 and the ending point of the state 5 is selected from codes which pass any one of the state 10, state 11, state 12, state 13, and state 14.

(3-7) The code with the starting point of the state 3 and the ending point of the state 7 is selected from codes which pass an arbitrary state.

(3-9) The code with the starting point of the state 3 and the ending point of the state 9 is selected from codes which pass any one of the state 10, state 11, state 12, state 13, and state 14.

(3-11) The code with the starting point of the state 3 and the ending point of the state 11 is selected from codes which pass an arbitrary state.

(3-13) The code with the starting point of the state 3 and the ending point of the state 13 is selected from codes which pass an arbitrary state.

(5-1) The code with the starting point of the state 5 and the ending point of the state 1 is selected from codes which pass an arbitrary state.

(5-3) The code with the starting point of the state 5 and the ending point of the state 3 is selected from codes which pass an arbitrary state.

(5-5) The code with the starting point of the state 5 and the ending point of the state 5 is selected from codes which pass any one of the state 0, state 1, state 2, state 3, and state 4 and further pass any one of the state 10, state 11, state 12, state 13 and state 14, from codes which pass any one of the state 0, state 1, state 2, state 3, and state 4 and do not pass any one of the state 10, state 11, state 12, state 13, and state 14 (path set G2) in the case that the previous code passed any one of the state 10, state 11, state 12, state 13, and state 14, and from codes which pass any one of the state 10, state 11, state 12, state 13, and state 14 and do not pass any one of the state 0, state 1, state 2, state 3, and state 4 (path set G1) in the case that the previous code passed any one of the state 0, state 1, state 2, state 3, and state 4. (5-7): the code with the starting point of the state 5 and the ending point of the state 7 is selected from codes which pass an arbitrary state.

(5-9) The code with the starting point of the state 5 and the ending point of the state 9 is selected from codes which pass any one of the state 0, state 1, state 2, state 3, and state 4 and further pass any one of the state 10, state 11, state 12, state 13 and state 14, from codes which pass any one of the state 0, state 1, state 2, state 3, and state 4 and do not pass any one of the state 10, state 11, state 12, state 13, and state 14 (path set G2) in the case that the previous code passed any one of the state 10, state 11, state 12, state 13, and state 14, and from codes which pass any one of the state 10, state 11, state 12, state 13, and state 14 and do not pass any one of the state 0, state 1, state 2, state 3, and state 4 (path set G1) in the case that the previous code passed any one of the state 0, state 1, state 2, state 3, and state 4.

(5-11) The code with the starting point of the state 5 and the ending point of the state 11 is selected from codes which pass an arbitrary state.

(5-13) The code with the starting point of the state 5 and the ending point of the state 13 is selected from codes which pass an arbitrary state.

(7) All the codes with the starting point of the state 7 are selected from codes which pass any one of the state 0, state 1, state 2, state 3, and state 4 and pass any one of the state 10, state 11, state 12, state 13, and state 14.

(9-1) The code with the starting point of the state 9 and the ending point of the state 1 is selected from codes which pass an arbitrary state.

(9-3) The code with the starting point of the state 9 and the ending point of the state 3 is selected from codes which pass an arbitrary state.

(9-5) The code with the starting point of the state 9 and the ending point of the state 5 is selected from codes which pass any one of the state 0, state 1, state 2, state 3, and state 4 and further pass any one of the state 10, state 11, state 12, state 13 and state 14, from codes which pass any one of the state 0, state 1, state 2, state 3, and state 4 and do not pass any one of the state 10, state 11, state 12, state 13, and state 14 (path set G2) in the case that the previous code passed any one of the state 10, state 11, state 12, state 13, and state 14, and from codes which pass any one of the state 10, state 11, state 12, state 13, and state 14 and do not pass any one of the state 0, state 1, state 2, state 3, and state 4 (path set G1) in the case that the previous code passed any one of the state 0, state 1, state 2, state 3, and state 4.

(9-7) The code with the starting point of the state 9 and the ending point of the state 7 is selected from codes which pass an arbitrary state.

(9-9) The code with the starting point of the state 9 and the ending point of the state 9 is selected from codes which pass any one of the state 0, state 1, state 2, state 3, and state 4 and further pass any one of the state 10, state 11, state 12, state 13 and state 14, from codes which pass any one of the state 0, state 1, state 2, state 3, and state 4 and do not pass any one of the state 10, state 11, state 12, state 13, and state 14 (path set G2) in the case that the previous code passed any one of the state 10, state 11, state 12, state 13, and state 14, and from codes which pass any one of the state 10, state 11, state 12, state 13, and state 14 and do not pass any one of the state 0, state 1, state 2, state 3, and state 4 (path set GI) in the case that the previous code passed any one of the state 0, state 1, state 2, state 3, and state 4.

(9-11) The code with the starting point of the state 9 and the ending point of the state 11 is selected from codes which pass an arbitrary state.

(9-13) The code with the starting point of the state 9 and the ending point of the state 13 is selected from codes which pass an arbitrary state.

(11-1) The code with the starting point of the state 11 and the ending point of the state 1 is selected from codes which pass an arbitrary state.

(11-3) The code with the starting point of the state 11 and the ending point of the state 3 is selected from codes which pass an arbitrary state.

(11-5) The code with the starting point of the state 11 and the ending point of the state 5 is selected from codes which pass any one of the state 0, state 1, state 2, state 3, and state 4.

(11-7) The code with the starting point of the state 11 and the ending point of the state 7 is selected from codes which pass an arbitrary state.

(11-9) The code with the starting point of the state 11 and the ending point of the state 9 is selected from codes which pass any one of the state 0, state 1, state 2, state 3, and state 4.

(11-11) The code with the starting point of the state 11 and the ending point of the state 11 is selected from codes which pass any one of the state 0, state 1, state 2, state 3, and state 4.

(11-13) The code with the starting point of the state 11 and the ending point of the state 13 is selected from codes which pass any one of the state 0, state 1, state 2, state 3, and state 4.

(13-1) The code with the starting point of the state 13 and the ending point of the state 1 is selected from codes which pass an arbitrary state.

(13-3) The code with the starting point of the state 13 and the ending point of the state 3 is selected from codes which pass an arbitrary state.

(13-5) The code with the starting point of the state 13 and the ending point of the state 5 is selected from codes which pass any one of the state 0, state 1, state 2, state 3, and state 4.

(13-7) The code with the starting point of the state 13 and the ending point of the state 7 is selected from codes which pass an arbitrary state.

(13-9) The code with the starting point of the state 13 and the ending point of the state 9 is selected from codes which pass any one of the state 0, state 1, state 2, state 3, and state 4.

(13-11) The code with the starting point of the state 13 and the ending point of the state 11 is selected from codes which pass any one of the state 0, state 1, state 2, state 3, and state 4.

(13-13) The code with the starting point of the state 13 and the ending point of the state 13 is selected from codes which pass any one of the state 0, state 1, state 2, state 3, and state 4.

In the conditions (5-5), (5-9), (9-5) and (9-9), if the code passes any one of the state 0, state 1, state 2, state 3, and state 4, and further passes any one of the state 10, state 11, state 12, state 13, and state 14 when a 20-bit code is previously generated, then either codes of the path set G1 or path set G2 may be selected.

By setting these conditions, 68,057 codes starting from the state 1, state 3, state 11, or state 13 respectively, 66,636 codes starting from the state 5 or state 9 respectively, and 83,646 codes starting from the state 7 select 83,646 (a pair of one code of the path set GI and one code of the path set G2 is counted as one code) are ensured. Accordingly, it is usable as a code after conversion capable of unifying a path within 40 bits by selecting 65,536 (=$2^{16}$) codes respectively out of these codes described herein above and by correlating selected codes to 16-bit input digital data.

FIG. 7 to FIG. 9 show partially detailed examples of codes generated under the above-mentioned conditions out of codes generated, for example, according to the state transition diagram in FIG. 5. FIG. 7 to FIG. 9 show a portion of 216 20-bit codes corresponding to the 10 times state transition having the starting point of the state 1 and the ending point of the state 1.

For example, a path starting from the state 1 and ending to the state 1 through the state 6, state 11, state 12, state 13, state 14, state 13, state 12, state 11, and state 6 is a 20-bit code "01011111110000001010".

The code generated according to the state transition diagram in FIG. 5 is two times the codes in the case that the geometrical distance when Viterbi decoding is not decoded.

Referring it as RLL (d, k) code, the minimum number d of successive 0 is 0, and the maximum number k of successive 0 is 9.

20-bit codes generated as described herein above are previously stored in the memory 21. When a 16-bit digital data is supplied, the memory 21 reads a 20-bit code corresponding to the 16-bit digital data as a modulation code, and outputs it to the recording amplifier 2.

The memory 22 stores the state of ending point in the state transition corresponding to the just preceding 20-bit code out of the state 1, state 3, state 5, state 7, state 9, state 11, and state 13 in FIG. 5. This ending point is the starting point of the state transition for generating the next 20-bit code, a 20-bit code corresponding to the state transition having the state of this starting point coinciding with the state of this ending point is generated, and the state of the ending point of the state transition is stored in the memory 22. The conversion to 20-bit codes is performed thereby with continuous transition of the state. 216 codes for respective 7 types of code (codes having the starting point of state 1, state 3, state 5, state 7, state 9, state 11, or state 13) are prepared for one 16-bit data in the memory 21, and a code of the type corresponding to the ending point of the just preceding code is selected successively.

A value for indicating whether the state transition corresponding to the 20-bit code converted just preceding passes any one of the state 0, state 1, state 2, state 3, and state 4, and a value for indicating whether the state transition passes any one of the state 10, state 11, state 12, state 13, and state 14 are stored in the memory 23. These values are used in the next conversion for testing the condition (5-5), condition (5-9), condition (9-5), and condition (9-9) in the case that the starting point is the state 5 or state 9.

As described herein above, the modulator 1 successively converts 16-bit input digital data to 20-bit codes according to the table stored in the memory 21 with transition of the state in the step S1 in FIG. 4, and the converted 20-bit code is supplied to the recording amplifier 2.

Next in the step S2, the recording amplifier 2 supplies the 20-bit code converted by the modulator 1 to the media 3 as a recording data through the pick-up device or head device (not shown in the figure), and the supplied recording data is recorded in the media 3.

In the step S3, the recording data recorded in the media 3 is reproduced by a certain pick-up device or head device (not shown in the figure), amplified by the reproduction amplifier 4, equalized thereafter by the equalizer amplifier 5, and supplied to the sampling circuit 6 and PLL circuit 9. Operations in the reproduction amplifier 4, equalizer amplifier 5, and sampling circuit 6 give equivalently the inter-code interference due to PR1 characteristics to the data reproduced from the media (m-bit code train given by modulation).

The PLL circuit 9 generates a clock based on the input data, and supplies the generated clock to the sampling circuit 6, Viterbi decoder 7, and demodulator 8.

In the step S4, the sampling circuit samples the ternary data supplied from the equalizer 5 synchronously with the clock supplied from the PLL circuit 9. The data obtained by sampling is supplied to the Viterbi decoder 7.

Next in the step S5, the Viterbi decoder 7 decodes the ternary data supplied from the sampling circuit G to the binary data.

Figure 10:
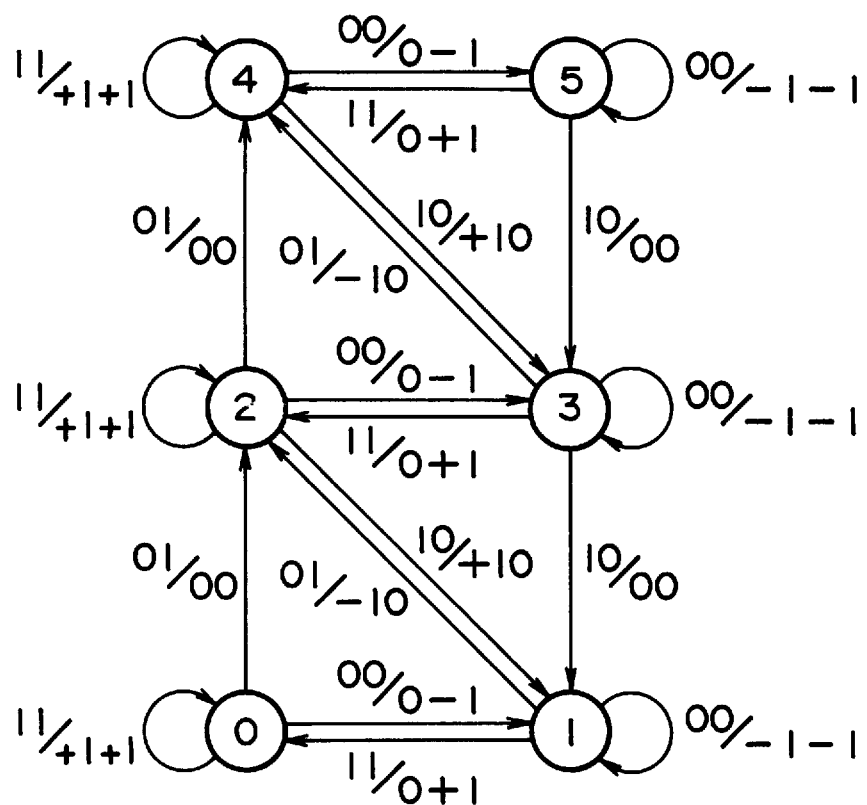
FIG. 10 is a diagram for describing the state transition of Viterbi detection.

FIG. 10 shows the state transition for Viterbi decoding in the Viterbi decoder 7. In other words, FIG. 10 is a state transition diagram for obtaining a probable decoded value using Viterbi decoding with consideration of inter-code interference of PR1. The state of FIG. 10 is a state during Viterbi decoding and different from the state during code generation in FIG. 5.

As shown in FIG. 10, 2*3 states (decoded state) are arranged on a plane having the horizontal axis and vertical axis in a matrix form. The reason why 2*3 states are arranged is that just preceding bit influences the current bit because three vertical states are provided in FIG. 5 and PR1 is used as the inter-code interference. FIG. 10 is a diagram derived based on FIG. 6.

In FIG. 10, for example, if 0−1 (input of 0 and −1 is abbreviated as 0−1 hereinafter) sampling data is supplied and the state transits to the right direction along the horizontal axis, then the Viterbi decoder 7 outputs a code of 00. On the contrary, if 0+1 sampling data is supplied and the state transits in the left direction along the horizontal axis, then the Viterbi decoder outputs a code of 11.

If the current state is the state 0 or state 2, 00 sampling data is supplied, and the state transits in the upward direction along the vertical axis, then the Viterbi decoder 7 outputs a code of 01. If the current state is the state 3 or state 5, 00 sampling data is supplied, and the state transits in the downward direction along the vertical axis, then the Viterbi decoder 7 outputs a code of 10.

If the current state is the state 1 or state 3, −10 sampling data is supplied, and the state transits along the inclined axis intersecting the vertical axis and horizontal axis namely state transition in the left upward direction (transition from the state 1 to the state 2, or transition from the state 3 to the state 4: transition to a larger number), then the Viterbi decoder 7 outputs a code of 01.

If the current state is the state 2 or state 4, +10 sampling data is supplied, and the state transits along the inclined axis intersecting the vertical axis and horizontal axis namely state transition in the right downward direction (transition from the state 2 to the state 1, or transition from the state 4 to the state 3: transition to a smaller number), then the Viterbi decoder 7 outputs a code of 10.

If the current state is the left side state (the state 0, state 2, and state 4) of the state arranged in a form of a right and left pair, a sampling value of +1+1 is supplied, and the state transits to itself, then the Viterbi decoder 7 outputs a code of 11. On the other hand, If the current state is the right side state (the state 1, state 3, and state 5) of the state arranged in a form of a right and left pair, a sampling value of −1−1 is supplied, and the state transits to itself, then the Viterbi decoder 7 outputs a code of 00.

Figure 11:
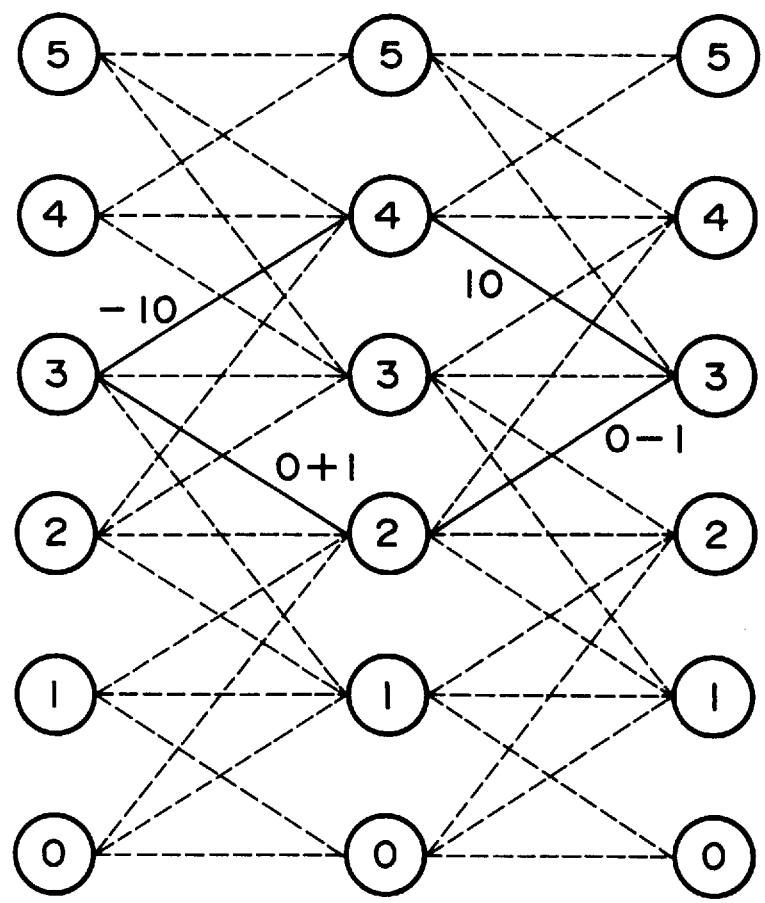
FIG. 11 is a trellis chart corresponding to the state transition in FIG. 10.

FIG. 11 represents a trellis chart corresponding to FIG. 10. For example, as shown with upper solid lines in FIG. 11, if the state transits from the state 3 to state 4, and then from the state 4 to the state 3, then a path composed of sampling values of −1, 0, +1 and 0 is obtained. On the other hand, as shown with the lower solid lines in FIG. 11, if the state transits from the state 3 to state 2, and then from the state 3 to state 3, then a path composed of sampling values of 0, +1, 0, and −1 is obtained.

The geometrical distance of the two paths are calculated herein under. The distance between the first value (bit) −1 of the upper path and the first value (bit) 0 of the lower path is 1, the distance between the second value (bit) 0 of the upper path and the second value (bit) +1 of the lower path is 1, the distance between the third value (bit) 1 of the upper path and the third value (bit) 0 of the lower path is 1, and the distance between the fourth value (bit) 0 of the upper path and the third value (bit) −1 of the lower path is 1, the geometrical distance is therefore 4 (=1+1+1+1). Though there are many other combinations, the geometrical distance is by no means less than 4.

As described herein above, by applying a code generated according to the state transition diagram in FIG. 5 to PR1 as shown in FIG. 10 and by performing Viterbi decoding, S/N ratio can be improved most effectively. Further, a code for PR1 generated according to the state diagram shown in FIG. 5 based on a known code of the geometrical distance of 4 for PR1 exhibits better performance.

As described herein above, the Viterbi decoder 7 decodes a ternary code (−1, 0, +1) supplied from the sampling circuit 6 to a binary value (0 or 1), and outputs the decoded code to the demodulator 8 in the step S5.

In the step S6, the demodulator 8 supplies the input code to the memory 31. In the memory 31, codes in complementary relationship to the memory 21 in FIG. 2 are stored as a table, and upon receiving a 20-bit code supplied from the Viterbi decoder 7, the memory 31 outputs a 16-bit data corresponding to the 20-bit code as a demodulation output referring to the table.

As described herein above, a 16-bit input digital data is converted to a 20-bit code in the modulator 1, and stored in the media 3. Then, the original 16-bit data is extracted by reproducing and demodulating the 20-bit code from the media 3.

Further, in the embodiment of the present invention described in FIG. 1, a pre-coder may be provided. Providing the pre-coder can prevent an error from occurring in other devices, compared with the case where no pre-coder is provided.

In the embodiment described herein above, a 20-bit code is generated by transition in 5*3 states, but a code may be generated by transition in more states (for example, 7*3).

In this embodiment, 20-bit codes are stored in the memory, and a 20-bit code is generated corresponding to a 16-bit input digital data, but this invention is by no means limited to this embodiment, a 20-bit code is generated without using a memory.

According to the code modulation method and code modulation device in accordance with the present invention, when the state transits from a certain state to another state in 5*3 states, 00 and 11 are assigned along the first axis, and 10 and 10 are assigned along the second axis, then, a 16-bit data is converted to a 20-bit code. The conversion efficiency is higher than the efficiency of the case that a 8-bit data is converted to a 12-bit data.

According to the code demodulation method and code demodulation device in accordance with the present invention, in 5*3 states, by assigning a code of 00 or 11 corresponding to the state transition in the direction along the first axis and by assigning a code of 01 or 10 corresponding to the state transition in the direction along the second axis, 16-bit data corresponding to generated 20-bit codes are stored. When a 20-bit digital data is supplied, the corresponding 16-bit code is read. Therefore, the original code can be read correctly.

According to the code decoding method in accordance with the present invention, 2*3 demodulation states are arranged along the third axis and fourth axis, when a certain input is provided correspondingly to the transition along the direction of each axis, an output value corresponding to the input is provided. Therefore, the input of PR1 is correctly decoded regardless of noise on the transmission path.

Various modifications and applications are possible within the scope of this invention. The scope of the present invention is by no means limited to the embodiment.

What is claimed is:

1. A code modulation method for converting 16-bit data to a 20-bit code comprising:

a first step for receiving said 16-bit data, and a second step for generating said 20-bit code corresponding to said 16-bit data, said 20-bit code being a code generated according to the state transition diagram composed of P×Q states, in said state transition diagram, P×Q states being arranged on the space having the first axis and second axis, a code of 00 being assigned when the state transits from a certain said state to another said state along said first axis in the first direction, a code of 11 being assigned when the state transits from a certain said state to another said state along the first axis in the second direction opposite to said first direction, a code of 01 being assigned when the state transits from a certain said state to another said state along said second axis in the third direction, a code of 10 being assigned when the state transits from a certain said state to another said state along said second axis in the fourth direction opposite to said third direction, and said 20-bit code comprising the combination of codes respectively assigned to the transition of said states.

2. The code modulation method as claimed in claim 1, wherein said P×Q is 5×3.

3. The code modulation method as claimed in claim 1, wherein said P×Q is 7×3.

4. The code modulation method as claimed in claim 1, wherein said 20-bit code corresponding to the transition having the starting point at said state positioned at one end in the direction of said first axis and positioned at the center in the direction of said second axis and having the ending point at said state positioned at the other end in the direction of said first axis and positioned at the center in the direction of said second axis is assigned to said 16-bit data.

5. The code modulation method as claimed in claim 1, wherein said 20-bit code corresponding to the transition having the starting point at said state positioned at one end in the direction of said first axis and positioned at the center in the direction of said second axis and having the ending point at said state positioned at the other end in the direction of said second axis and positioned adjacent to the end in the direction of said first axis is assigned to said 16-bit data.

6. The code modulation method as claimed in claim 1, wherein said 20-bit code corresponding to the transition having the starting point at said state positioned at an end in the direction of said first axis and positioned at the center in the direction of said second axis and having the ending point at said state positioned at the center in the direction of said first axis and positioned at the center in the direction of said second axis is assigned to said 16-bit data.

7. The code modulation method as claimed in claim 1, wherein said 20-bit code corresponding to the transition having the starting point at said state positioned at one end in the direction of said second axis and positioned adjacent to the end in the direction of said first axis and having the ending point at said state positioned at the other end in the direction of said second axis and positioned adjacent to the end in the direction of said first axis is assigned to said 16-bit data.

8. The code modulation method as claimed in claim 1, wherein said 20-bit code corresponding to the transition having the starting point at said state positioned at the end in the direction of said second axis and positioned adjacent to the end in the direction of said first axis and having the ending point at said state positioned at the center in the direction of said first axis and positioned at the center in the direction of said second axis is assigned to said 16-bit data.

9. The code modulation method as claimed in claim 1, wherein said 20-bit code is applied to partial response (1, 1) and Viterbi decoded.

10. A code modulation device for converting a 16-bit data to a 20-bit code comprising receiving means for receiving said 16-bit data, and generation means for generating said 20-bit code corresponding to said 16-bit data, said 20-bit code being a code generated according to the state transition diagram composed of P×Q states, in said state transition diagram, P×Q states being arranged on the space having the first axis and second axis, a code of 00 being assigned when the state transits from a certain said state to another said state along said first axis in the first direction, a code of 11 being assigned when the state transits from a certain said state to another said state along the first axis in the second direction opposite to said first direction, a code of 01 being assigned when the state transits from a certain said state to another said state along said second axis in the third direction, a code of 10 being assigned when the state transits from a certain said state to another said state along said second axis in the fourth direction opposite to said third direction, and said 20-bit code comprising the combination of codes respectively assigned to the transition of said states.

11. The code modulation device as claimed in claim 10, wherein said generation means has a code memory for storing said 20-bit codes, said code memory reads and outputs said assigned 20-bit code when said 16-bit data is supplied.

12. The code modulation device as claimed in claim 11, wherein said generation means further has a state memory for storing said state as the starting point.

13. The code modulation device as claimed in claim 10, wherein said P×Q is 5×3.

14. The code modulation device as claimed in claim 10, wherein said P×Q is 7×3.

15. The code modulation device as claimed in claim 10, wherein said 20-bit code corresponding to the transition having the starting point at said state positioned at one end in the direction of said first axis and positioned at the center in the direction of said second axis and having the ending point at said state positioned at the other end in the direction of said first axis and positioned at the center in the direction of said second axis is assigned to said 16-bit data.

16. The code modulation device as claimed in claim 10, wherein said 20-bit code corresponding to the transition having the starting point at said state positioned at one end in the direction of said first axis and positioned at the center in the direction of said second axis and having the ending point at said state positioned at the other end in the direction of said second axis and positioned adjacent to the end in the direction of said first axis is assigned to said 16-bit data.

17. The code modulation device as claimed in claim 10, wherein said 20-bit code corresponding to the transition having the starting point at said state positioned at an end in the direction of said first axis and positioned at the center in the direction of said second axis and having the ending point at said state positioned at the center in the direction of said first axis and positioned at the center in the direction of said second axis is assigned to said 16-bit data.

18. The code modulation device as claimed in claim 10, wherein said 20-bit code corresponding to the transition having the starting point at said state positioned at one end in the direction of said second axis and positioned adjacent to the end in the direction of said first axis and having the ending point at said state positioned at the other end in the direction of said second axis and positioned adjacent to the end in the direction of said first axis is assigned to said 16-bit data.

19. The code modulation device as claimed in claim 10, wherein said 20-bit code corresponding to the transition having the starting point at said state positioned at the end in the direction of said second axis and positioned adjacent to the end in the direction of said first axis and having the ending point at said state positioned at the center in the direction of said first axis and positioned at the center in the direction of said second axis is assigned to said 16-bit data.

20. The code modulation device as claimed in claim 10, wherein said 20-bit code is applied to partial response (1, 1) and Viterbi decoded.

21. A code demodulation method for converting a 20-bit code to 16-bit data comprising the first step for receiving said 20-bit code and the second step for generating 16-bit data corresponding to said 20-bit code, said 20-bit code being any one of codes generated according to the state transition diagram composed of P×Q states, in said state transition diagram, P×Q states being arranged on the space having the first axis and second axis, a code of 00 being assigned when the state transits from a certain said state to another said state along said first axis in the first direction, a code of 11 being assigned when the state transits from a certain said state to another said state along the first axis in the second direction opposite to said first direction, the code of 01 being assigned when the state transits from a certain said state to another said state along said second axis in the third direction, a code of 10 being assigned when the state transits from a certain said state to another said state along said second axis in the fourth direction opposite to said third direction, and said 20-bit code comprising the combination of codes respectively assigned to the transition of said states.

22. The code demodulation method as claimed in claim 21, wherein said P×Q is 5×3.

23. The code demodulation method as claimed in claim 21, wherein said P×Q is 7×3.

24. A code demodulation device for converting a 20-bit code to 16-bit data comprising a means for receiving said 20-bit code and a generation means for generating 16-bit data corresponding to said 20-bit code, said 20-bit code being any one of codes generated according to the state transition diagram composed of P×Q states, in said state transition diagram, P×Q states being arranged on the space having the first axis and second axis, a code of 00 being assigned when the state transits from a certain said state to another said state along said first axis in the first direction, a code of 11 being assigned when the state transits from a certain said state to another said state along the first axis in the second direction opposite to said first direction, a code of 01 being assigned when the state transits from a certain said state to another said state along said second axis in.the third direction, a code of 10 being assigned when the state transits from a certain said state to another said state along said second axis in the fourth direction opposite to said third direction, and said 20-bit code comprising the combination of codes respectively assigned to the transition of said states.

25. The code demodulation device as claimed in claim 24, wherein said generation means has a code memory for storing said 16-bit data, said code memory reads and outputs said assigned 16-bit data when said 20-bit code is supplied.

26. The code demodulation device as claimed in claim 24, wherein said P×Q is 5×3.

27. The code demodulation device as claimed in claim 24, wherein said P×Q is 7×3.

28. A code decoding method wherein said code decoding method comprises, the first step for receiving a supplied 20-bit code, said 20-bit code is a code generated according to the state transition diagram composed of P×Q (both P and Q are positive integers) states, in said state transition diagram, P×Q states are arranged on the space having the first axis and second axis, a code of 00 is assigned when the state transits from a certain said state to another said state along said first axis in the first direction, a code of 11 is assigned when the state transits from a certain said state to another said state along the first axis in the second direction opposite to said first direction, a code of 01 is assigned when the state transits from a certain said state to another said state along said second axis in the third direction, a code of 10 is assigned when the state transits from a certain said state to another said state along said second axis in the fourth direction opposite to said third direction, and said 20-bit code comprises the combination of codes respectively assigned to the transition of said states, the second step for providing inter-code interference due to partial response (1,1) characteristics, and the third step for decoding the 20-bit code provided with said inter-code interference in said second step using Viterbi decoding, wherein in said third step, said Viterbi decoding is performed according to the state transition diagram composed of 2×Q states, in said state transition diagram, 2×Q demodulation states are arranged along the third axis and forth axis, the code of 00 is generated when the state transits from a certain demodulation state to another demodulation state along said third axis in the fifth direction and the sampling value of 0−1 is supplied, the code of 11 is generated when the state transits from a certain demodulation state to another demodulation state along said third axis in the sixth direction opposite to said fifth direction and the sampling value of 0+1 is supplied, the code of 01 is generated when the state transits from ascertain demodulation state to another demodulation state along said fourth axis in the seventh direction and the sampling value of 00 is supplied, the code of 10 is generated when the state transits from a certain demodulation state to another demodulation state along said fourth axis in the eighth direction opposite to said seventh direction and the sampling value of 00 is supplied, the code of 10 is generated when the state transits from a certain demodulation state to another demodulation state in the ninth direction along said sixth axis intersecting said third axis and fourth axis and the sampling value of +10 is supplied, the code of 01 is generated when the state transits from a certain demodulation state to another demodulation state in the tenth direction opposite to said ninth direction along said sixth axis and the sampling value of −10 is supplied, the code of 00 is generated when the state transits from the demodulation state disposed in the fifth direction to the demodulation state and the sampling value of −1−1 is supplied in the demodulation state arranged in a form of a pair in said fifth direction and sixth direction, and the code of 11 is generated when the state transits from the demodulation state disposed in the sixth direction to the demodulation state and the sampling value of 11 is supplied in the demodulation state arranged in a form of a pair in said fifth direction and sixth direction.

29. The code decoding method as claimed in claim 28, wherein said code decoding method additionally comprises the fourth step for generating a 16-bit data corresponding to said 20-bit code obtained in said third step.

30. The code decoding method as claimed in claim 28, wherein said P is 5 and said Q is 3.

31. The code decoding method as claimed in claim 28, wherein said P is 7 and said Q is 3.

32. A code decoding device wherein said code decoding device comprises, means for receiving a supplied 20-bit code, said 20 bit code is a code generated according to the state transition diagram comprising P×Q (both P and Q are positive integers) states, in said state transition diagram, P×Q states are arranged on the space having the first axis and second axis, a code of 00 is as signed when the state transits from a certain said state to another said state along said first axis in the first direction, a code of 11 is assigned when the state transits from a certain said state to another said state along the first axis in the second direction opposite to said first direction, a code of 01 is assigned when the state transits from a certain said state to another said state along said second axis in the third direction, a code of 10 is assigned when the state transits from a certain said state to another said state along said second axis in the fourth direction opposite to said third direction, and said 20-bit code comprises the combination of codes respectively assigned to the transition of said states, means for providing inter-code interference due to partial response (1, 1) characteristics, and decoding means for decoding the 20-bit code provided with said inter-code interference by said inter-code interference means using Viterbi decoding, wherein in said decoding means, said Viterbi decoding is performed according to the state transition diagram composed of 2×Q states, in said state transition diagram, 2×Q demodulation states are arranged along the third axis and forth axis, the code of 00 is generated when the state transits from a certain demodulation state to another demodulation state along said third axis in the fifth direction and the sampling value of 0−1 is supplied, the code of 11 is generated when the state transits from a certain demodulation state to another demodulation state along said third axis in the sixth direction opposite to said fifth direction and the sampling value of 0+1 is supplied, the code of 01 is generated when the state transits from a certain demodulation state to another demodulation state along said fourth axis in the seventh direction and the sampling value of 00 is supplied, the code of 10 is generated when the state transits from a certain demodulation state to another demodulation state along said fourth axis in the eighth direction opposite to said seventh direction and the sampling value of 00 is supplied, the code of 10 is generated when the state transits from a certain demodulation state to another demodulation state in the ninth direction along said sixth axis intersecting said third axis and fourth axis and the sampling value of +10 is supplied, the code of 0 1 is generated when the state transits from a certain demodulation state to another demodulation state in the tenth direction opposite to said ninth direction along said sixth axis and the sampling value of −10 is supplied, the code of 00 is generated when the state transits from the demodulation state disposed in the fifth direction to the demodulation state and the sampling value of −1−1 is supplied in the demodulation state arranged in a form of a pair in said fifth direction and sixth direction, and the code of 11 is generated when the state transits from the demodulation state disposed in the sixth direction to the demodulation state and the sampling value of 11 is supplied in the demodulation state arranged in a form of a pair in said fifth direction and sixth direction.

33. The code decoding device as claimed in claim 32, wherein said code decoding device has a generation means for generating a 16-bit data corresponding to said 20-bit code obtained in said decoding means.

34. The code decoding device as claimed in claim 32, wherein said P is 5 and said Q is 3.

35. The code decoding device as claimed in claim 32, wherein said P is 7 and said Q is 3.

* * * * *